United States Patent
Suh

[19]
[11] Patent Number: 5,864,497
[45] Date of Patent: Jan. 26, 1999

[54] MEMORY DEVICE HAVING DIVIDED GLOBAL BIT LINES

[75] Inventor: Jung Won Suh, Ichonshi, Rep. of Korea

[73] Assignee: Hyundai Electronics Industries, Co., Ltd., Rep. of Korea

[21] Appl. No.: 961,544

[22] Filed: Oct. 30, 1997

Related U.S. Application Data

[63] Continuation of Ser. No. 652,333, May 22, 1996, abandoned.

[30] Foreign Application Priority Data

May 22, 1995 [KR] Rep. of Korea ............ 1995-12759

[51] Int. Cl.⁶ ........................................... G11C 5/06
[52] U.S. Cl. ........................... 365/72; 365/189.05
[58] Field of Search .................. 365/72, 189.05

[56] References Cited

U.S. PATENT DOCUMENTS 5,535,172  7/1996  Reddy et al. ............... 365/189.05
5,561,626  10/1996  Fujii ............................. 365/72

Primary Examiner—David C. Nelms
Assistant Examiner—Michael T. Tran
Attorney, Agent, or Firm—Blakely Sokoloff; Taylor & Zafman

[57] ABSTRACT

A memory device having a hierarchical bit line for decreasing the size of a chip, wherein a global bit line is divided into two parts. Switches are provided for selecting the divided global bit lines and sub-bit lines connected to memory cells that store data in a folded bit line structure.

12 Claims, 10 Drawing Sheets

FIG. 2A
(PRIOR ART)
FIG. 2B
(PRIOR ART)
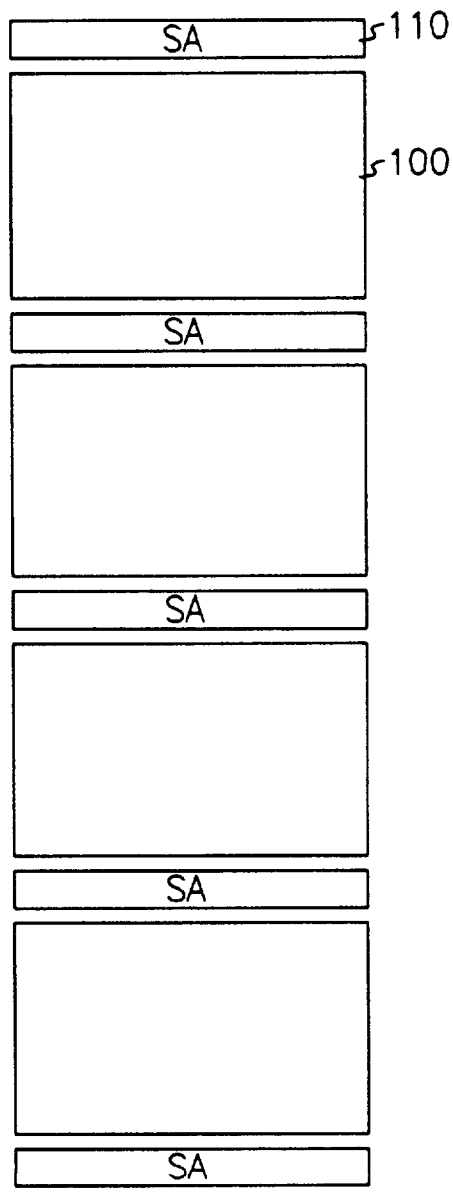
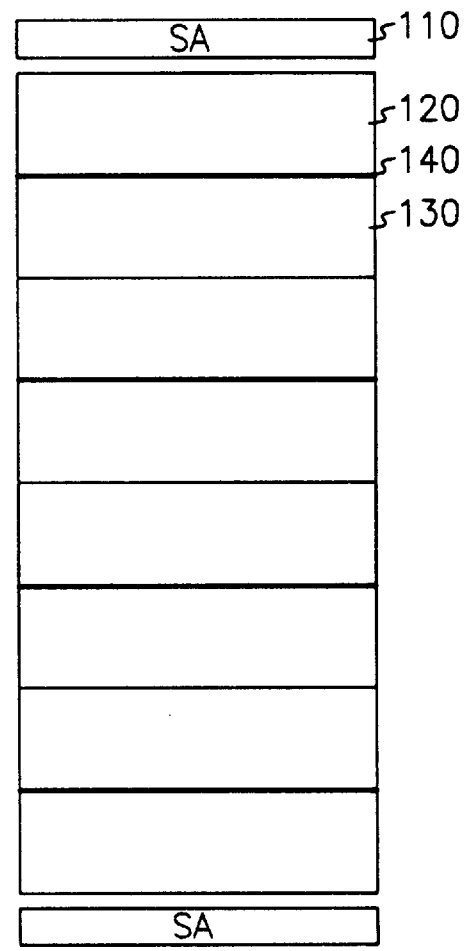

5,864,497

MEMORY DEVICE HAVING DIVIDED GLOBAL BIT LINES

This is a Rule 1,62 Continuation of application Ser. No. 08/652,333, filed May 22, 1996, now abandoned.

BACKGROUND OF THE INVENTION

1. Field of the Invention

The present invention relates to a memory device having a hierarchical bit line for lessening the size of a chip, and more particularly to a memory device having a hierarchical bit line structure of which a global bit line can be divided into two parts.

2. Description of Prior Art

In general, one of the most important factors in the memory devices is the price. Therefore, the method to increase an yield and adopt an economical manufacturing process can be used. In addition, the way of increasing the namer of dies, which are integrated within the chips, is available. As usual, the size of the die can be lessened by means of scaling down the design rule which is applied to the design of the memory device with an advanced process.

The area or cells and sense amplifiers occupy a large proportion of the VLSI memory device. In a highly integrated memory device, the number of the cells connected to the bit line keeps constant, which comes from the fact that the ratio of the bit line capacitance and the cell capacitance should be low for a stable read operation of the memory cell.

Thus, the number of the sense amplifiers increases in proportion to the higher integration of the memory. Therefore, the size of the die can be diminished by decreasing the number of the sense amplifier.

As mentioned above, the bit line having a hierarchy can be adopted for the method of decreasing the number of the sense amplifier.

FIG. 1A shows a hierarchical bit line in accordance with a prior art.

The bit line connected to the cells has m(a natural number) sub bit line/lines SBi and /SBi(/SBi is an inverted signal of SBi) (1<i<m), respectively, which are connected to the global bit line GB and /GB by a transistor 4 used as a switch.

In addition, the numeral 1 is a word line, 2 is a cell, 3 is a control signal line for connecting the sub bit line to the global bit line, 5 is a sense amplifier, and 10 is a switching part used for connecting the sub bit line to the global bit line.

FIG. 1B illustrates the operation of the prior hierarchical bit line.

In case of the access to the cell for read and write operation, only the sub bit line SB2 and /SB2 connected to the cell 2 is connected to the global bit line GB and /GB, and the rest of the sub bit lines are separated so that the total capacitance of the bit line, and the total number of the sense amplifiers can be decreased.

FIG. 2A shows the area of the cell array 100 and the area of the sense amplifier 110 of the prior art.

FIG. 2B shows the area of the cell array 120, 130, and the area of the sense amplifier array 110, and the area of the switching part array 140 when a hierarchical bit line is applied.

In the hierarchical bit line of FIG. 2B, compared with the prior hierarchical bit line, it is noted that in case the number of the cell connected to the global bit line is increased as many as 4 times, the area is decreased by the difference between the area of 3 sense amplifier arrays 110 and the area of the switching part array 140.

In general, the resistance and the capacitance of the sub bit line are high, because it uses tungsten-polycide (W-polycide) consisting of polysilicon layer and tungsten silicide layer. However, the resistance and the capacitance of the global bit line are low, because a metal layer is used.

Therefore, when the prior hierarchical bit line is applied to the memory product, the major drawback is that it is difficult to acquire an easy manufacturing process and a high yield because a width and a gap of the global bit line should be set in a minimum feature size.

SUMMARY OF THE INVENTION

It is an object of the present invention is to provide a memory having hierarchical bit line structure of which the number of the global bit line is decreased by the half.

In accordance with an aspect of the present invention, there is provided an memory device including memory cells storing data in folded bit line structure, comprising: a plurality of amplifiers for transferring data stored in said memory cells to an input/output means; a plurality of first global bit lines which are divided into a plurality of parts according to the number of said memory cells and are selectively connected to said amplifiers; a plurality of second global bit lines which are divided into a plurality of parts corresponding to said first global bit lines and are selectively connected to said amplifiers; a plurality of first switching means for selectively connecting said divided global bit lines by first control signal; a plurality of pairs of subsidiary bit lines which are composed of first and second bit lines, being connected to said memory cells; and a plurality of second switching means for electrically connecting said pairs of subsidiary bit lines to said first or second global bit lines by second control signals, wherein said first and second bit lines are respectively connected to different parts of said divided global bit lines through said second switching means and said divided global bit lines connected to said subsidiary bit lines is connected to said amplifiers.

In accordance with another aspect of the invention, there is an memory device, comprising: a plurality of amplifiers for transferring data stored in said memory cells to an input/output means; a plurality of memory block including: a first bit line connected to a first memory cell; a second bit line connected to a second memory cell, wherein said second bit line forms a first bit line pair with said first bit line; a third bit line connected to a third memory cell; a fourth bit line connected to a fourth memory cell, wherein said fourth bit line forms a second bit line pair with said third bit line; word lines connected to said first to fourth memory cell, respectively, for selecting said memory cells; a first global bit line which is selectively connected to one of said amplifiers; a second global bit line which is selectively connected to another of said amplifier; a first switching means for selectively connecting said first bit line to said first global bit line and connecting said second bit line to said second global bit line, using a first control signal; a second switching means for selectively connecting said third bit line to said first global bit line and connecting said fourth bit line to said second global bit line, using a second control signal; and a third switching means for selectively connecting said first global bit line to said second global bit line by a third control signal when memory cell is said memory block is not selected, whereby said first and second global line selectively transfer one of neighboring cell data.

In accordance with the other aspect of the invention, there is an memory device including memory cells storing data in open bit line structure, comprising: a plurality of amplifiers for transferring data stored in said memory cells to an input/output means; a plurality of global bit lines which are divided into a plurality of parts according to the number of said memory cells and are selectively connected to said amplifiers; a plurality of first switching means for selectively connecting said divided global bit lines by first control signal; a plurality of pairs of subsidiary bit lines which are composed of first and second bit lines, being connected to said memory cells; and a plurality of second switching means for electrically connecting said pairs of subsidiary bit lines to said global bit lines by second control signals, wherein said first and second bit lines are respectively connected to different parts of said divided global bit lines through said second switching means and said divided global bit lines connected to said subsidiary bit lines is connected to said amplifiers.

BRIEF DESCRIPTION OF THE DRAWINGS

This invention may be better understood and its object will become apparent to those skilled in the art by reference to accompanying drawings as follows:

FIGS. 2A and 2B are schematic diagrams illustrating the area of the chip using a conventional bit line and that using a hierarchical bit line in accordance with the present invention;

DETAILED DESCRIPTION OF THE INVENTION

Figure 1A:
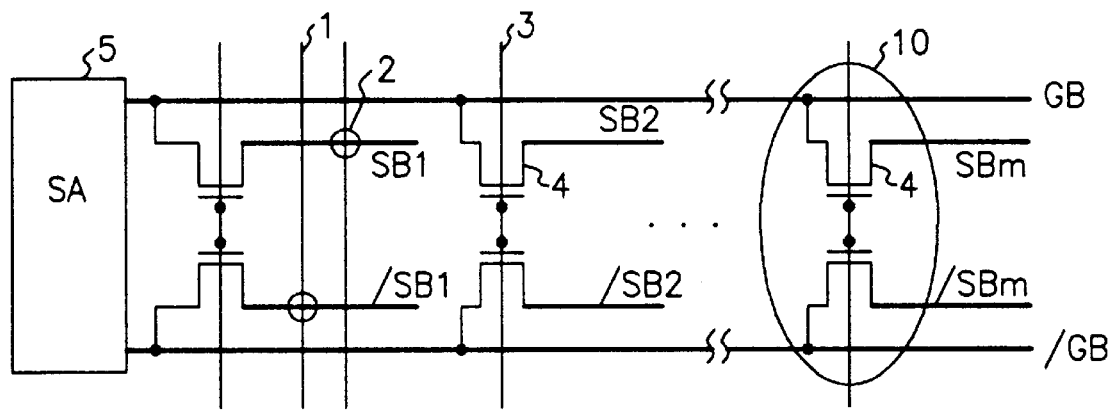
FIG. 1A is a schematic diagram illustrating the structure of a conventional hierarchical bit line.
Figure 1B:
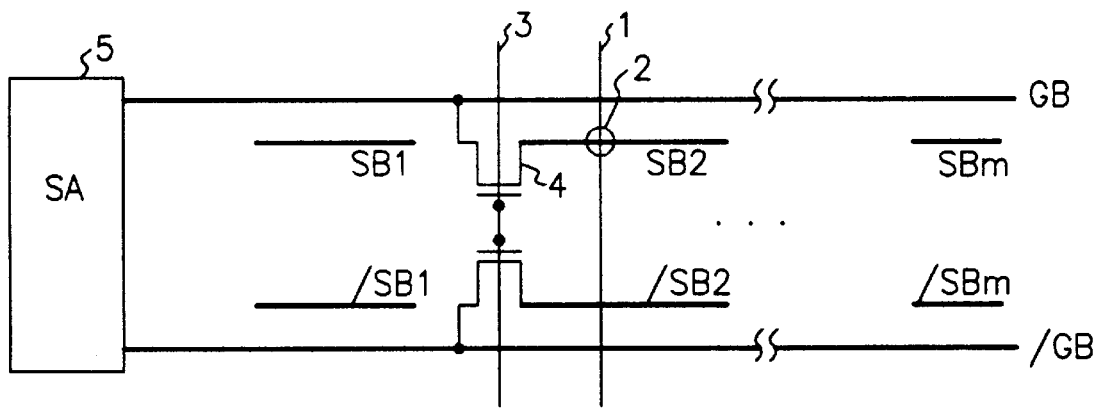
FIG. 1B is a schematic diagram illustrating the operation of FIG. 1A.
Figure 3A:
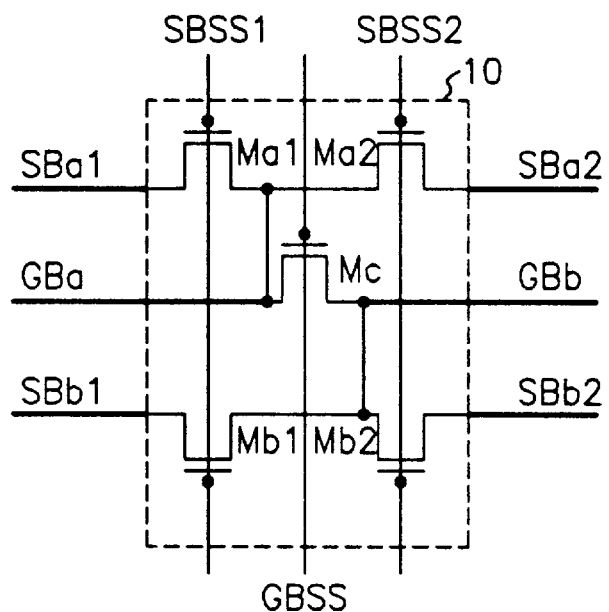
FIG. 3A is a schematic diagram illustrating a circuit of a switching part constituting a hierarchical bit line in accordance with the present invention.

Referring to FIG. 3A, a switching part for forming hierarchical bit line in accordance with the present invention is illustrated.

A global bit line separation signal GBSS is applied to a transistor Mc of which gate. The transistor Mc, which operates as an switch, makes the first global bit line GBa separated from the second global bit line.

Transistors Ma1 and Nb1 are switches which connect sub bit lines SBa1 and SBb1 to the first and second global bit lines GBa and GBb in accordance with a sub bit line separation signal SBSS1, respectively. Also, transistors Ma2 and Mb2 are switches which connect sub bit lines SBa2 and SBb2 to the first and second global bit lines GBa and GBb in accordance with a sub bit line separation signal SBSS2, respectively.

Figure 3B:
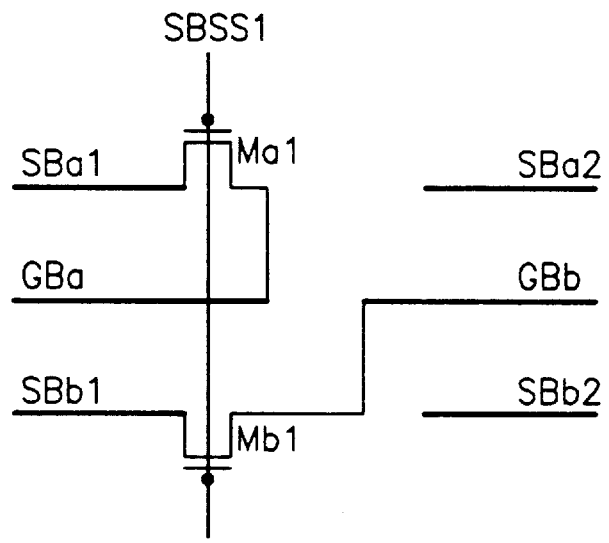
FIGS. 3B and 3C is a schematic diagrams illustrating the operation of FIG. 3A.
Figure 3C:
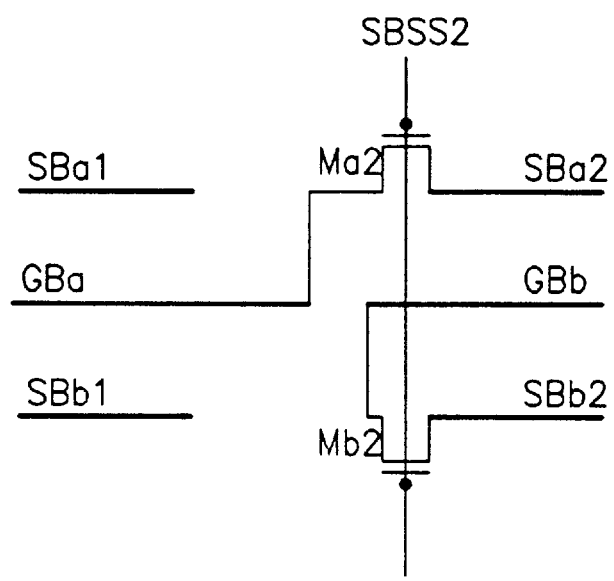

FIGS. 3B and 3C are schematic views for illustrating operation of the switching part in FIG. 3A.

As shown in FIG. 3B, the sub bit lines SBa1 and SBb1 are respectively connected to the first and second global bit lines GBa and GBb when the sub bit line separation signal SBSS1 is activated and the transistors Ma1 and Mb1 is turned on. At this time, the sub bit line separation signal SBSS2 is applied to the transistor Mc such that the global bit line is divided into the first and second global bit lines GBa and GBb.

Referring to FIG. 3C, the right sub bit lines SBa2 and SBb2 are respectively connected to the first and second global bit lines GBa and GBb when the sub bit line separation signal SBSS1 is not activated and the transistors Ma1 and Mb1 is turned off. Similarly, the sub bit line separation signal SBSS2 is activated and the transistors Ma2 and Mb2 is turned on. The global bit line is divided into the first and second global bit lines GBa and GBb, by the transistor Mc in responses to the global bit line separation signal GBSS.

Figure 4A:
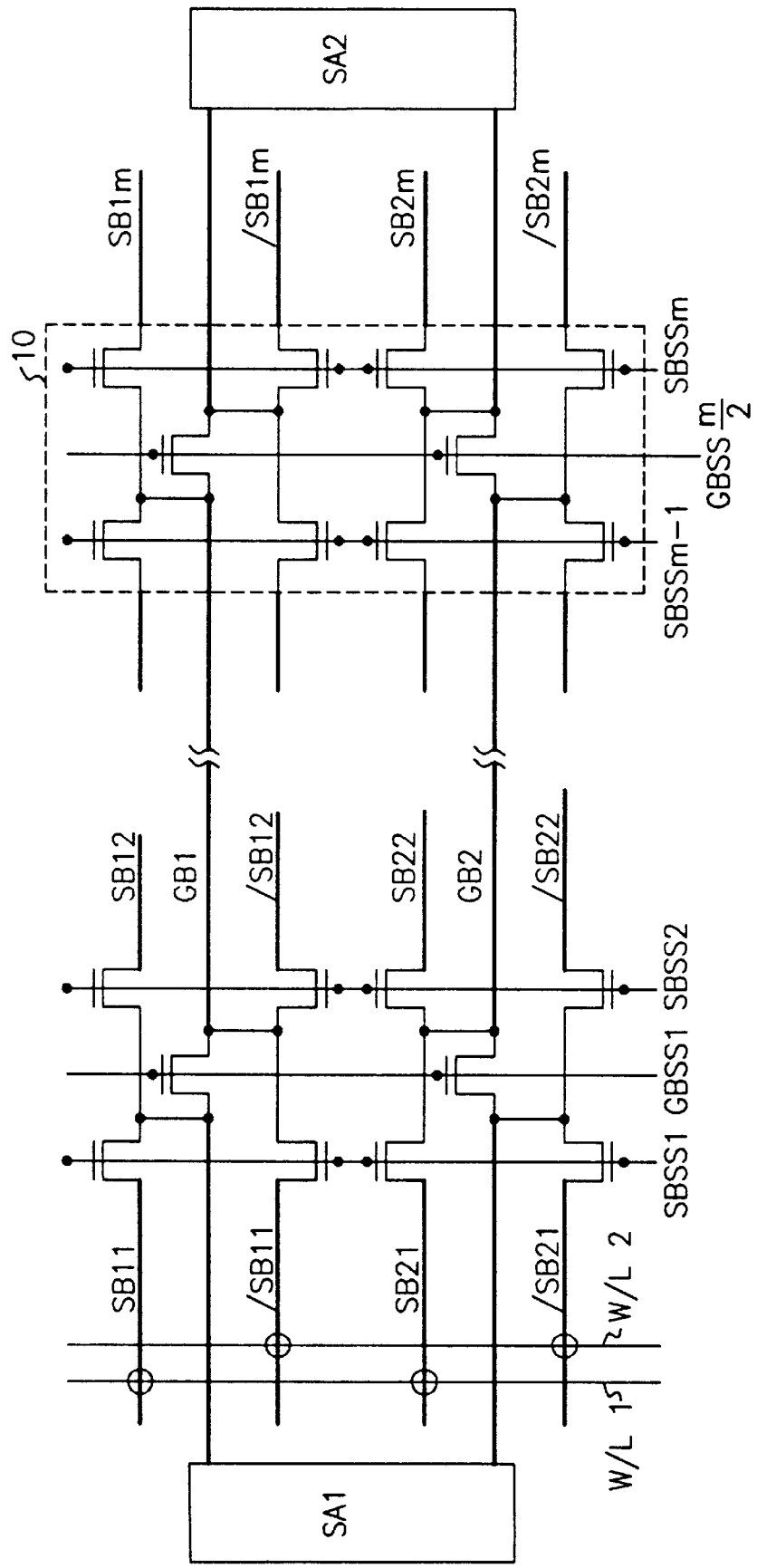
FIG. 4A is a schematic diagram illustrating an embodiment in accordance with the present invention having a folded bit line.

FIG. 4A shows a schematic view of is a folded bit line structure having a hierarchical bit line in accordance with the present invention.

In an embodiment of the present invention, the hierarchial bit line consists of a plurality of sub bit lines SB1i (1<i<m), /SB1i, SB2i and /SB2i, global bit lines GB1 and GB2, and switching parts.

A pair of sub bit lines SB11 and SB21 are connected to two cells on a word line W/L1, respectively. Another pair of sub bit lines /SB11 and /SB21 are connected to other two cells on another word line W/L2, respectively.

The global bit lines GB1 and GB2 are connected to two sense amplifier SA1 and SA2 which sense and amplify the data stored in the cells.

A plurality of the sub bit lines are connected to one of the global bit lines GB1 and GB2 in accordance with the global bit line separation signal GBSSi (1<i<m/2).

Figure 4B:
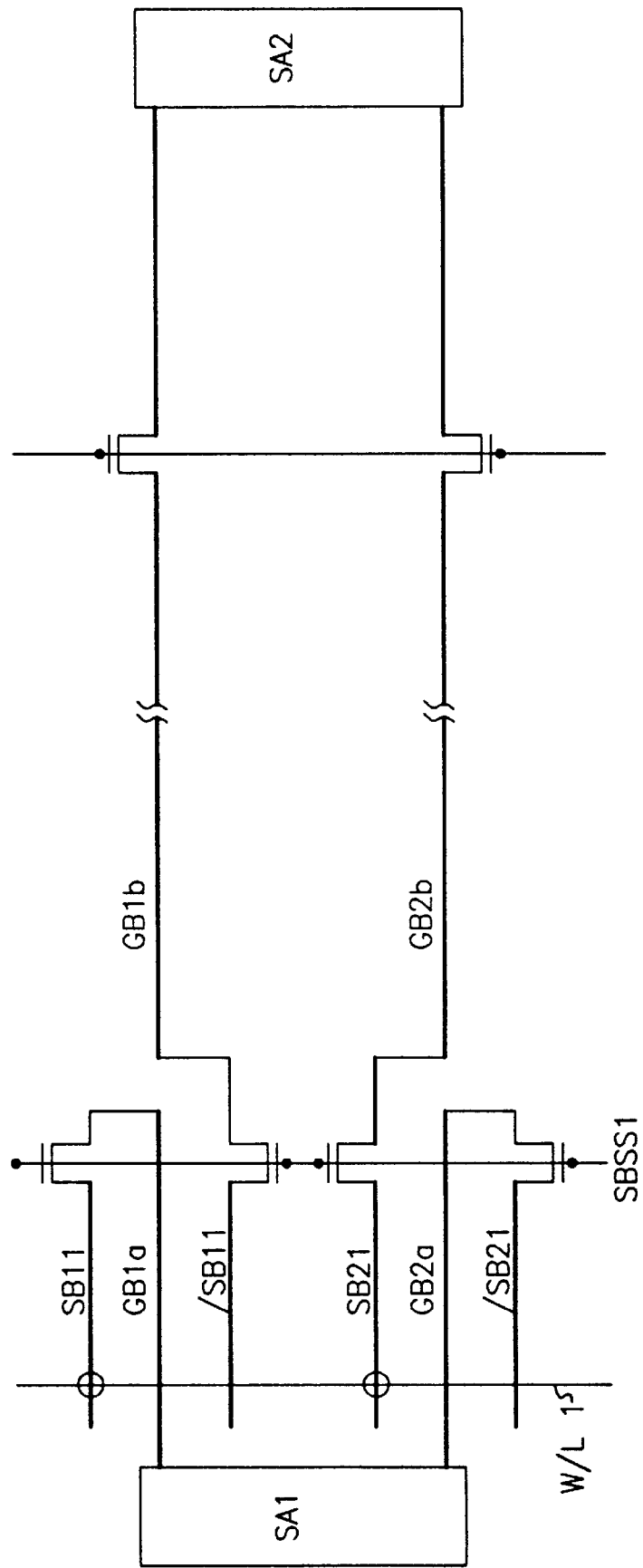
FIG. 4B is a schematic diagram illustrating the operation of FIG. 4A.

FIG. 4B shows a schematic view illustrating operations of FIG. 4A.

If the cells on the sub bit lines SB11 and SB21 are accessed, the global bit line is divided into the two global bit lines GB1a and GB1b responsive to the global bit line separation signal GBSS1. The sub bit lines SB11 and /SB21 are connected to the global bit lines GB1a and GB2a respectively in accordance with the sub bit line separation signal SBSS1. The sense amplifier SA1 senses cell data. Also, the sub bit lines SB21 and,/SB11 are connected to the global bit lines GB2b and GB1b respectively. The sense amplifier SA2 senses cell data.

In this case, the other switching signals GBSSi(2<i<m/2) is applied to the corresponding switching transistors, and the other sub bit line separation signals are not received, such that the other sub bit lines except the sub bit lines SB11, SB21, /SB11 and /SB21 connected to the sense amplifier are separated from the global bit lines.

Write operation is performed as the same method as the above described read operation.

Figure 5A:
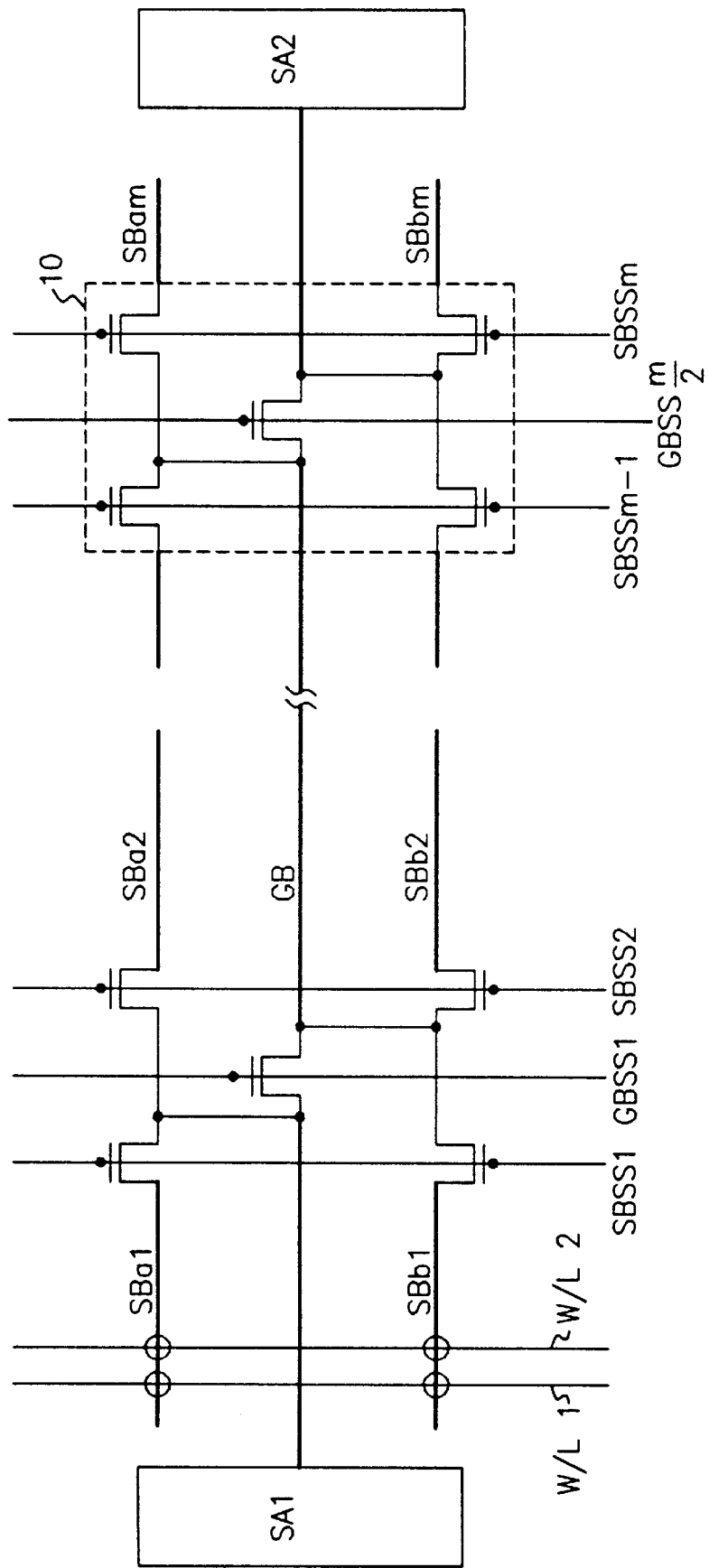
FIG. 5A is a schematic diagram illustrating an embodiment in accordance with the present invention having an open bit line.

FIG. 5A shows an open hierarchical bit line in accordance with another embodiment of the present invention.

As illustrated in FIG. 5A, a memory cell array consists of a plurality of sub bit lines SBai and SBbi(1<i<m), a global bit line GB, and a plurality of switches.

The two pairs of sub bit lines are connected to four cells on word lines W/L1 and W/L2. The global bit line GB is connected between the sense amplifiers SA1 and SA2. The sense amplifiers SA1 and SA2 sense and amplify cell data. The switching part connects a plurality of the sub bit lines to the global bit line GB in accordance with the global bit line separation signal GBSSi (1<i<m/2). Also, the switching part connects the sub bit lines to the global bit line GB in accordance with the sub bit line separation signal SBSSi (1<i<m).

Figure 5B:
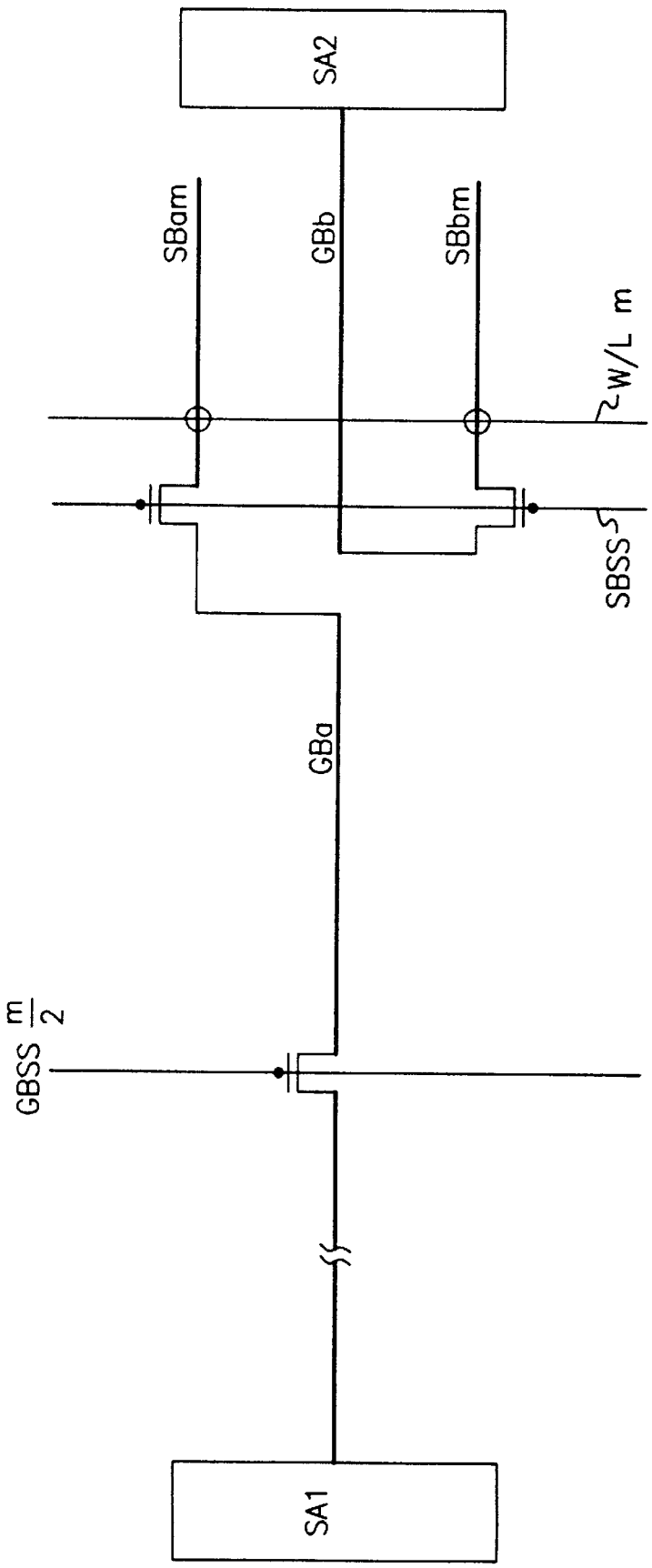
FIG. 5B is a schematic diagram illustrating the operation of FIG. 5A.

FIG. 5B shows a schematic view illustrating operation of the present invention.

Assuming that sub bit lines SBam and SBbm, a global bit line GB is divided into global bit lines GBa and GBb in accordance with the global bit line separation signal GBSSm/2 to the connect sub bit lines SBam and SBbm to the sense amplifiers SA1 and SA2, respectively. At this time, the sub bit line SBam is connected to the global bit line GBa in accordance with the sub bit line separation signal SBSSm. The sense amplifier SA1 senses cell data which are connected to the sub bit line SBam. The sub bit line SBbm is connected to the global bit line GBb, and the sense amplifier SA2 senses cell data which are connected to the sub bit line SBbm.

The other global bit line separation signals are applied to the corresponding switching transistors, and the other sub bit line separation signals are not selected, such that the sub bit lines except the sub bit lines SBam and SBbm connected the sense amplifier are separated from the global bit line GB. Write operation is performed as the same method as the read operation.

Figure 6:
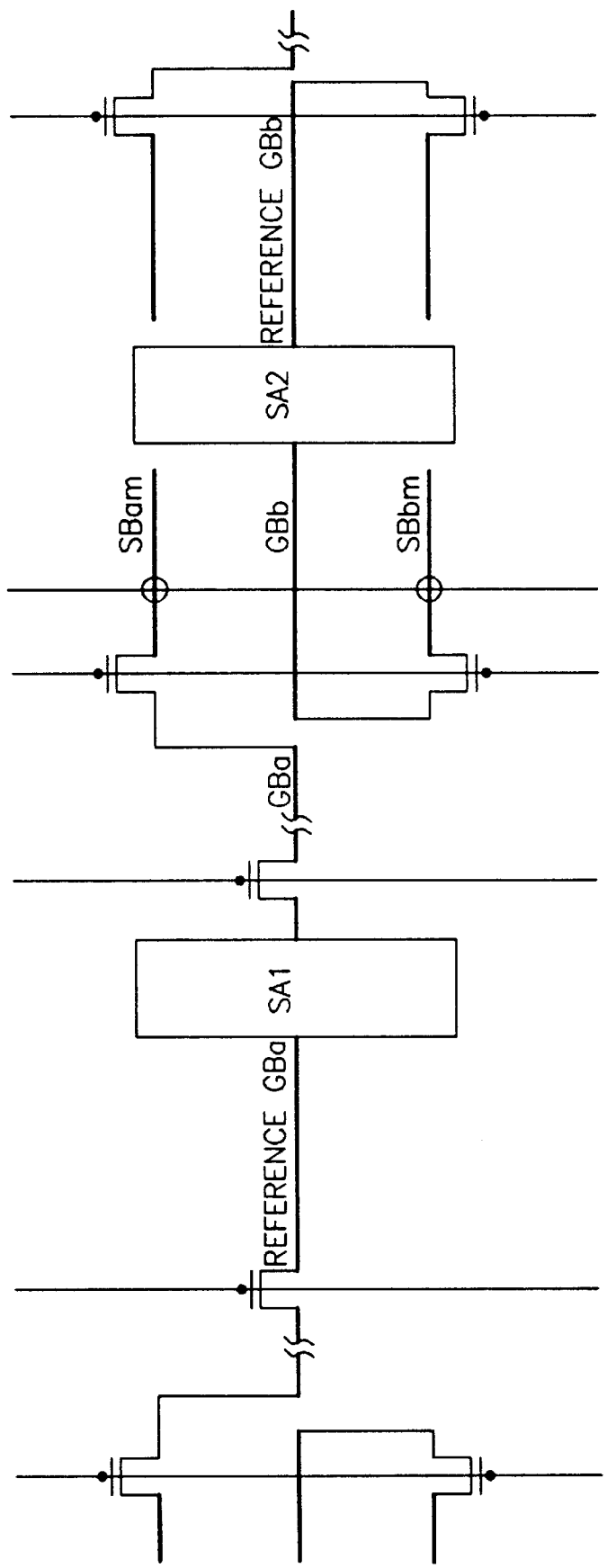
FIG. 6 is a schematic diagram illustrating the method of enabling a switching part in accordance with the present invention.

FIG. 6 shows a schematic view illustrating a method for making both sides of sense amplifiers have the same capacitance loads in the open bit line structure in accordance with the present invention.

In open bit line structure of the present invention, sub bit lines are symmetrically arranged in memory cell array in the middle of the operating sense amplifier, such that capacitance loads in both sides of sense amplifier are all the same. Therefore, the present invention can reduce the power consumption by reducing the whole capacitance load derived by the sense amplifiers.

Figure 7:
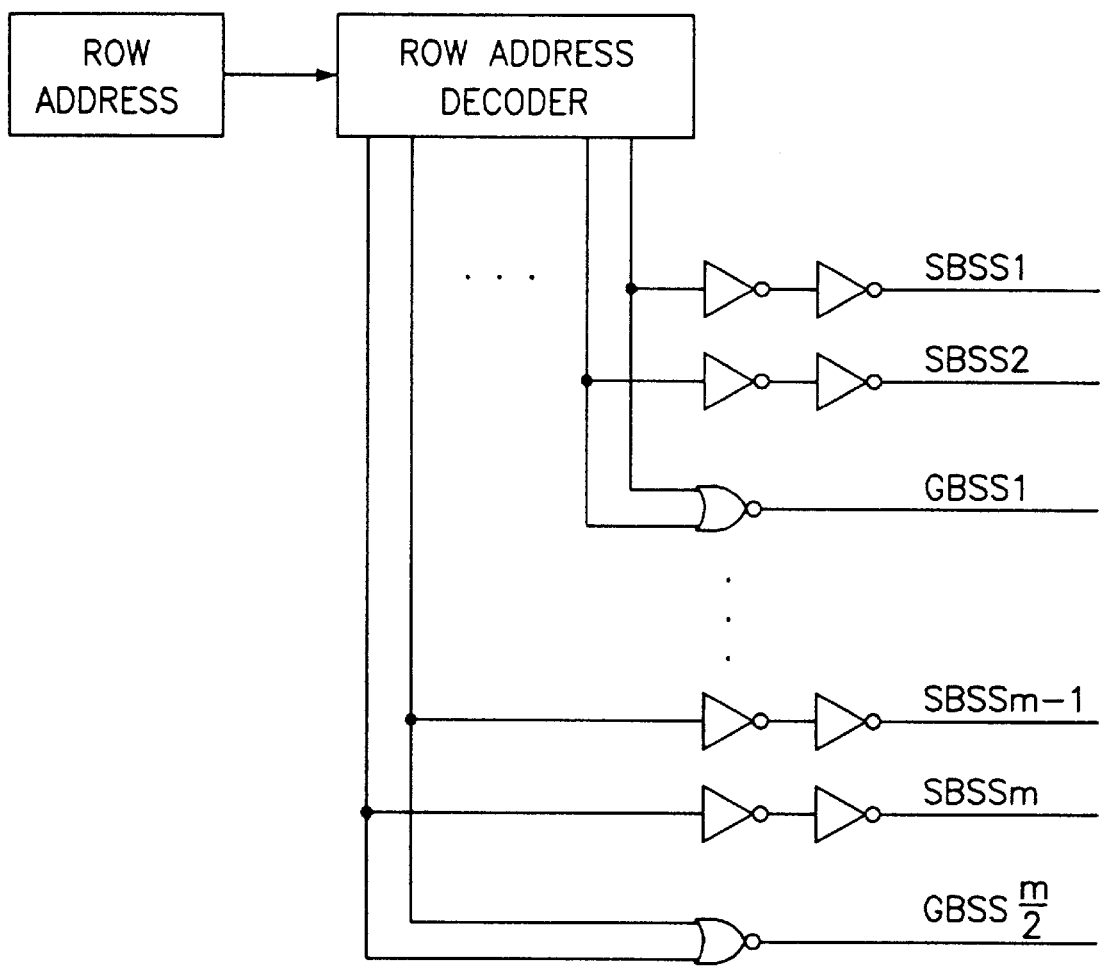
FIG. 7 is a schematic diagram illustrating a circuit for generating the control signal of a global bit line and a sub bit

FIG. 7 shows a schematic view illustrating a method for generating global bit lines separation signals GBSSi(1<i<m/2) and sub bit lines separation signals SBSSi(1<i<m).

In read or write operation, the word line for accessing cell is selected by decoding a row address. The sub bit line separation signal SBSSi connecting the sub bit line to the global bit line become active as high before the word line selected in row address decoding is activated.

The rest of sub bit line separation signals which are not selected and not activated, are separated from the global bit lines.

The global bit line separation signals GBSSi are the results of NOR gate provided with two sub bit line separation signals SBSSi. Accordingly, with the generation of the global bit line separation signal through the NOR gate, the global bit line is divided into two parts in transferring cell data because the global bit line separation signal which is generated by the sub bit line separation signal in a high state is in a low state and the other global bit line separation signal is in a high state.

When the row address are changed, the results of the decoder are changed by the changed address. The sub bit line, which is connected to the word line accessed by the above-mentioned method, is connected to the global bit line, and the global bit lines are separated by two parts.

As apparent from the above description, a global bit line is separated by two parts in transferring cell data, and can control two sub bit lines. Therefore, the present invention has an effect that chip size is reduced, and the cost of a memory become down. Furthermore, the present invention is capable of easily making a global bit line, and reducing power consumption.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device including memory cells storing data in folded bit line structure, comprising:

a plurality of amplifiers for transferring data stored in said memory cells to an input/output means a plurality of first global bit lines, each of which is divided into a plurality of parts according to the number of said memory cells, being selectively connected to said amplifiers;

a plurality of second global bit lines, each of which is divided into a plurality of parts corresponding to said first global bit lines, being selectively connected to said amplifiers;

a plurality of first switching means for selectively connecting to each other said divided first and second global bit lines in response to first control signals;

a plurality of pairs of subsidiary bit lines, each of which includes first and second bit lines, being connected to said memory cells; and a plurality of second switching means for selectively connecting said pairs of subsidiary bit lines to said first and second global bit lines, respectively, in response to second control signals, wherein said first and second bit lines are respectively connected to different parts of said divided first and second global bit lines through said second switching means.

2. The memory device in accordance with claim 1, wherein said second control signals are applied to said second switching means before activate signals are applied to said memory cells.

3. The memory device in accordance with claim 1, said first control signals are generated by operating said second control signals.

4. A memory device including memory cells storing data in open bit line structure, comprising:

a plurality of amplifiers for transferring data stored in said memory cells to an input/output means;

a plurality of global bit lines, each of which is divided into a plurality of parts according to the number of said memory cells, being selectively connected to said amplifiers;

a plurality of first switching means for selectively connecting to each other said divided global bit lines in response to first control signals;

a plurality of pairs of subsidiary bit lines, each of which includes first and second bit lines, being connected to said memory cells; and a plurality of second switching means for selectively connecting said pairs of subsidiary bit lines to said global bit lines by second control signals, wherein said first and second bit lines are respectively connected to different parts of said divided global bit lines through said second switching means and said divided global bit lines connected to said subsidiary bit lines is connected to said amplifiers.

5. The memory device in accordance with claim 4, wherein said second control signals are applied to said second switching means before activate signals are applied to said memory cells.

6. The memory device in accordance with claim 4, said first control signals are generated by operating said second control signals.

7. A memory device, comprising:

a plurality of amplifiers for transferring data stored in said memory cells to an input/output means;

a plurality of memory blocks including:

a plurality of first bit lines connected to first memory cells;

a plurality of second bit lines connected to second memory cells, wherein said second bit lines form first bit line pairs with said first bit lines;

a plurality of third bit lines connected to third memory cells;

a plurality of fourth bit lines connected to fourth memory cells, wherein said fourth bit lines form second bit line pairs with said third bit lines;

a plurality of word lines connected to said first to fourth memory cells, respectively, for selecting said memory cells;

a first global bit line which is divided into a plurality of parts;

a second global bit line which is divided into a plurality of parts;

a first switching means for selectively connecting said first bit line to one part of said first global bit line, said second bit line to another part of said first global bit line, said third bit line to one part of said second global bit line, and said fourth bit line to another part of said second global bit line, in response to first control signals;

a second switching means for selectively connecting divided first and second global bit lines, respectively, in response to second control signals, whereby said first and second bit lines are coupled to said amplifiers different from each other and said third and fourth bit lines are coupled to said amplifiers different from each other.

8. The memory device in accordance with claim 7, wherein said first control signals are applied to said first switching means before activate signals are applied to said word lines.

9. The memory device in accordance with claim 7, said second control signals are generated by operating said first control signals.

10. The memory device in accordance with claim 7, wherein said first and second control signals are produced from row address signals.

11. The memory device in accordance with claim 1, wherein said first and second control signals are produced from row address signals.

12. The memory device in accordance with claim 4, wherein said first and second control signals are produced from row address signals.

* * * * *

UNITED STATES PATENT AND TRADEMARK OFFICE
CERTIFICATE OF CORRECTION

PATENT NO. : 5,864,497

DATED : January 26, 1999

INVENTOR(S) : Suh

It is certified that error appears in the above-identified patent and that said Letters Patent is hereby corrected as shown below:

On the Title Page:

In [56], delete "Blakely Sokoloff; Taylor & Zafman" and insert -- Blakely Sokoloff Taylor & Zafman -- .

In column 1, line 16, delete "the namer of dies" and insert -- the number of dies -- .

In column 1, line 38, delete "($1<i<m$)" and insert -- ($1 \leq i \leq m$) -- .

In column 3, line 49, delete "and a sub bit" and insert -- and a sub bit line. -- .

In column 4, line 28, delete "($1<i<m$)" and insert -- ($1 \leq i \leq m$) -- .

In column 4, line 40, delete "($1<i<m/2$)" and insert -- ($1 \leq i \leq m/2$) -- .

In column 4, line 50, delete "SB21 and, SB11" and insert -- SB21 and SB11 -- .

Signed and Sealed this

Tenth Day of April, 2001

Attest:

NICHOLAS P. GODICI

*Attesting Officer*   *Acting Director of the United States Patent and Trademark Office*